(12) United States Patent
Lai et al.

(10) Patent No.: US 7,242,660 B2
(45) Date of Patent: Jul. 10, 2007

(54) POWER CONTROL DEVICE AND METHOD OF SINGLE BASE POWER FOR OPTICAL DISK DRIVE

(75) Inventors: Ronnie Lai, Taipei (TW); Ronald Chen, Taipei (TW)

(73) Assignee: VIA Technologies, Inc., Shindian, Taipei (TW)

( * ) Notice: Subject to any disclaimer, the term of this patent is extended or adjusted under 35 U.S.C. 154(b) by 0 days.

(21) Appl. No.: 11/339,546

(22) Filed: Jan. 26, 2006

(65) Prior Publication Data

US 2006/0164899 A1 Jul. 27, 2006

Related U.S. Application Data

(60) Provisional application No. 60/646,633, filed on Jan. 26, 2005.

(51) Int. Cl.
G11B 7/00 (2006.01)

(52) U.S. Cl. .................... 369/116; 369/44.12

(58) Field of Classification Search ............ 369/44.12, 369/44.41, 44.42, 47.1, 47.15, 106, 116; 315/224, 244, 291, 307
See application file for complete search history.

(56) References Cited

U.S. PATENT DOCUMENTS 6,434,087 B1 * 8/2002 Schell et al. ............. 369/13.02

| 6,671,248 | B2 * | 12/2003 | Miyabata et al. | ........... 369/116 |
| 7,038,988 | B2 * | 5/2006 | Turner et al. | ........... 369/53.37 |
| 7,133,337 | B2 * | 11/2006 | Miyaki | ........... 369/47.5 |
| 2005/0157603 | A1 * | 7/2005 | Tseng et al. | ........... 369/30.14 |

* cited by examiner

Primary Examiner—Shih-Chao Chen
Assistant Examiner—Minh Dieu A
(74) Attorney, Agent, or Firm—Bacon & Thomas, PLLC

(57) ABSTRACT

A power control device of single base power is provided for an optical read/write module of an optical disk drive. The optical read/write module generates a power feedback signal and a temperature signal. The power control device includes a current compensating module, a current computing module and a current integrating module. The current compensating module generates an operating current compensating signal and a threshold compensating signal according to the power feedback signal, the temperature signal, a base power signal and a function relationship between the temperature signal and the threshold current of the optical read/write module. The current computing module receives the operating current compensating signal to compute a first operating current signal and a second operating current signal based on the operating current compensating signal according to the base power signal and a reference power signal. The current integrating module receives the threshold current compensating signal, the first operating current signal and the second operating current signal to generate a power control signal to drive the optical read/write module.

20 Claims, 11 Drawing Sheets

POWER CONTROL DEVICE AND METHOD OF SINGLE BASE POWER FOR OPTICAL DISK DRIVE

BACKGROUND OF THE INVENTION

1. Field of Invention

The invention relates to a power control device and a method thereof and, in particular, to a power control device and a method thereof of single base power for an optical disk drive.

2. Related Art

An optical read/write module of an optical disk drive is easily affected by heat thus the performance and accurate of the electric device may be influenced. In order to control the electric device at different temperatures, a proper control module must be designed to modify the affection resulted from the thermal factor.

Referring to FIG. 1, an optical disk drive 1 includes an optical read/write module 11 and a power control module 12. The optical read/write module 11 includes a light-emitting unit 111, a light-sensing unit 112, and a plurality of current control units 113, 114 and 115. The light-sensing unit 112 detects the output power of the light-emitting unit 111 and generates a power feedback signal 112A. The power control module 12 determines whether the output power of the light-emitting unit 111 reaches a target value according to the power feedback signal 112A, and generates a power control signal 121 according to the determination. In addition, the current control units 113 to 115 modulate the currents 113A to 115A according to the power control signal 121, respectively. Therefore, after being driven by the currents 113A to 115A, the light-emitting unit 111 generates the output power reaching the target value.

Referring to FIG. 2, when the light-emitting unit 111 is at a temperature T1, the output power and the operating current of the light-emitting unit 111 are related in a line L1. In other words, when the operating temperature of the light-emitting unit 111 is at the temperature $T_1$ and the operating current is at currents $I_b$, $I_e$, or $I_w$, the light-emitting unit 111 generates the output power at powers $P_b$, $P_e$ or $P_w$.

In order to control the operating currents generated by the light-emitting unit 111 exactly at the different powers, the conventional power control module 12 controls the currents 113A, 114A and 115A respectively to be equal to the current $I_b$, the current $I_e$ minus the current $I_b$, and the current $I_w$ minus the current $I_e$. Besides, the light-emitting unit 111 can be driven by the different combinations of the currents 113A to 115A.

For example, if the power control module 12 controls the light-emitting unit 111 to generate the output power at the power $P_e$, the current control units 113 and 114 are enabled by the power control module 12. Therefore, the light-emitting unit 111 is driven only by the currents 113A (current $I_b$) and 114A (current $I_e$ minus current $I_b$) to generate the output power at the power $P_e$.

On the other hand, if the temperature of the light-emitting unit 111 rises to a temperature $T_2$, the power control module 12 increases the operating current of the light-emitting unit 111 (as dotted line A) with a closed feedback control method based on the power $P_e$ according to the power feedback signal 112A until the output power of the light-emitting unit 111 reaches the power $P_e$.

However, the operating current of the light-emitting unit 111 is still equal to the current $I_e$, such that the light-emitting unit 111 generates the output power at the power $P_e'$. In order to adjust the output power of the light-emitting unit 111 to the power $P_w$, the power control module 12 computes the current $I_w'$ resulting in the power $P_w$ according to the current $I_e$ and the relationship between the power $P_w$ and the power $P_e'$, as shown in formula 1.

$$I_w' = \frac{P_w}{P_e}(I_e' - I_e) + I_w \qquad (1)$$

In addition, A current $I_b'$ resulting in the power $P_b$ is computed in the same computing method. Therefore, the power control module 12 can control the currents 113A, 114A and 115A respectively be equal to the current $I_b'$, the current $I_e$ minus the $I_b'$, the current $I_w'$ minus the $I_e$. Accordingly, the light-emitting unit 111 is able to generate the output power at different powers ($P_b$, $P_e$, $P_w$) at the temperature $T_2$. In brief, the conventional technology is to compute the operating-currents of the light-emitting unit 111 to generate the output power at different powers at the temperature $T_2$ according to the line $L_2$.

However, when the light-emitting unit 111 actually reaches the temperature $T_2$, the output power and the operating current of the light-emitting unit 111 are not related in the line $L_2$ but a line $L_3$. Therefore, the operating current computed according to the conventional technology is the current $I_w'$, so that the light-emitting unit 111 generates the output power at power $P_w'$ (as dotted line B), which is not correctly controlled at power $P_w$. In the same manner, the light-emitting unit 111 does not generate the output power at power $P_b$ (as dotted line C) correctly. The errors in the above cases are caused by that the conventional technology ignores the threshold-current $I_{t1}$ and $I_{t2}$ (intersection points of line $L_1$ and line $L_3$ with the current axis, repectively). As shown in FIG. 3, the temperature of the light-emitting unit 111 is in exponential relation to the threshold-current. If the threshold-current is insufficient, the operating-current computed by the conventional technology for obtaining the output power at different temperature would not have an obvious error. However, if the threshold-current is sufficient or the output power is to be precisely controlled, the error of the operating-current computed by the conventional technology is inevitable.

Referring to FIG. 4, the light-emitting unit 111 of the conventional optical read/write module 11 generates the output power $P_{out}$ to access an optical disk. If the temperature of the light-emitting unit 111 changes (for example, increasing the temperature), the output power $P_{out}$ is well controlled at the power $P_e$ but not the power $P_w$ and $P_b$ due to the regardless of the threshold-current. Further, according to the increase of the temperature, the output power $P_{out}$ lapses from the wrinting power $P_w$ and $P_b$ (the dotted line in FIG. 4).

Similarly, as shown in FIG. 5, according to the conventional method and multipulse write strategy, only the power Pb as the base power can be controlled correctly. And, the output power $P_{out}$ lapses from the correct wrinting power $P_w$ (the dotted line in FIG. 5). Therefore, the optical read/write module 11 does not correctly access the optical disk, and, even more, the lifetime of the optical read/write module 11 and the endurance of the optical disk drive 1 are reduced.

It is therefore a subject of the invention to provide an optical disk drive with a single power baseline control, which considers an effect of the threshold-current of the optical read/write module in the optical disk drive at different temperature, and computes the operating-current for driving the optical read/write module to generate the distinct output power according to a single power baseline. Thus, the output power of the optical read/write module can be precisely controlled.

SUMMARY OF THE INVENTION

In view of the foregoing, the invention is to provide a power control device and method of single base power, which control the optical read/write module to generate correct output power according to the temperature and the output power of the optical read/write module.

To achieve the above, a power control device of single base power is provided for an optical read/write module of an optical disk drive. The optical read/write module generates a power feedback signal and a temperature signal. The power control device includes a current compensating module, a current computing module and a current integrating module. The current compensating module generates an operating current compensating signal and a threshold compensating signal according to the power feedback signal, the temperature signal, a base power signal and a function relationship between the temperature signal and the threshold current of the optical read/write module. The current computing module receives the operating current compensating signal to compute a first operating current signal and a second operating current signal based on the operating current compensating signal according to the base power signal and a reference power signal. The current integrating module receives the threshold current compensating signal, the first operating current signal and the second operating current signal to generate a power control signal to drive the optical read/write module.

To achieve the above, a power control method of single base power is provided for an optical read/write module of an optical disk drive. The optical read/write module generates a power feedback signal and a temperature signal. The power control method includes the following steps of: generating an operating current compensating signal and a threshold compensating signal according to the power feedback signal, a base power signal and a function relationship between the temperature signal and the threshold current of the optical read/write module; computing a first operating current signal and a second operating current signal based on the operating current compensating signal according to the base power signal and a reference power signal; and integrating the threshold current compensating signal, the first operating current signal and the second operating current signal to generate a power control signal to drive the optical read/write module.

As mentioned above, since the power control device and method compensate the threshold current of the optical read/write module according to the temperature signal of the optical read/write module, the effect of the threshold current is regarded. And the distinct required operating currents driving the optical read/write module to generate different output power are computed base on a single base power, such that the output power of the optical read/write module is precisely controlled.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 6:
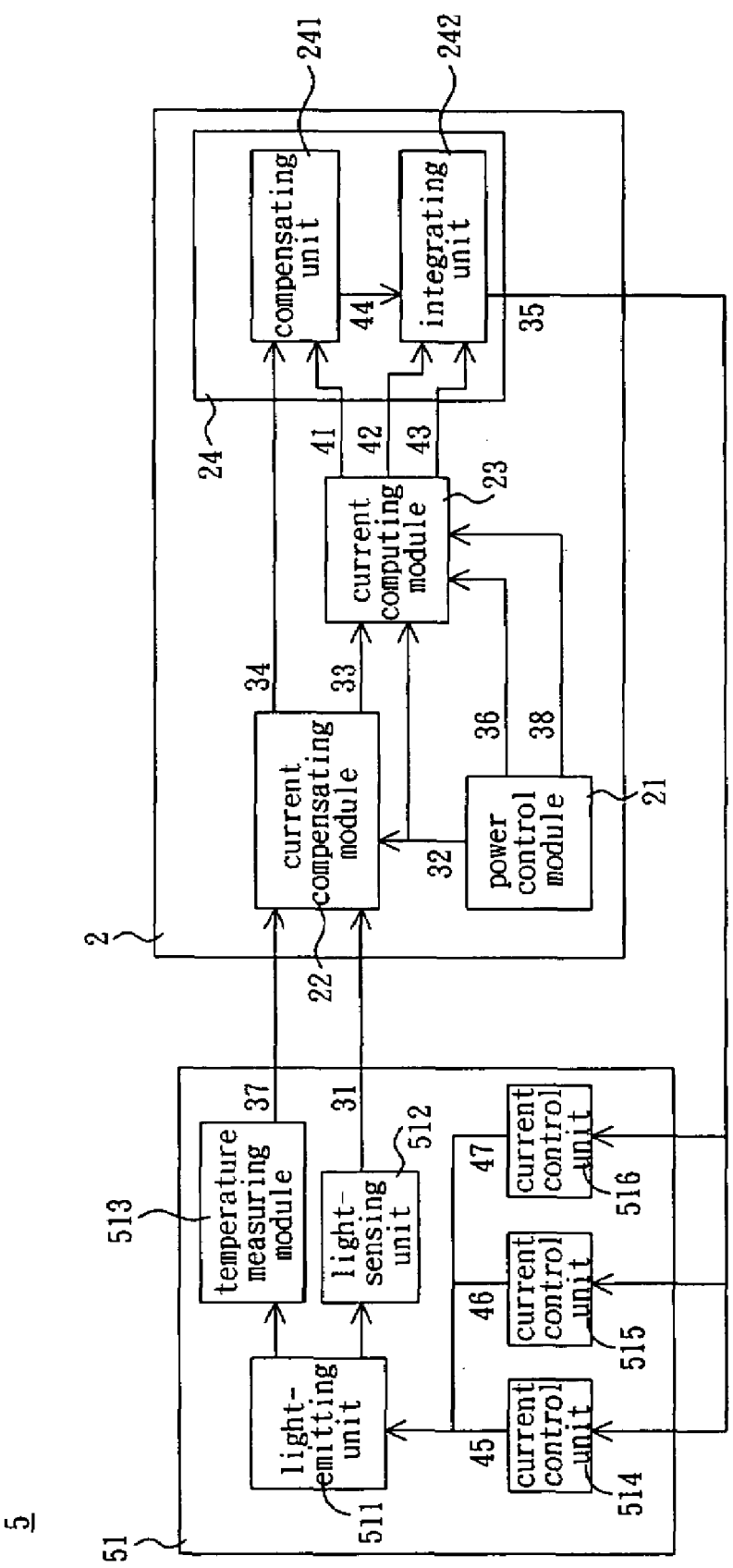
FIG. 6 is a block diagram showing a power control device of single base power according to a preferred embodiment of the invention.

Referring to FIG. 6, a power control device 2 of single base power includes a power control module 21, a current compensating module 22, a current computing module 23 and a current integrating module 24. The current integrating module 24 includes a compensating unit 241 and an integrating unit 242.

In this embodiment, the power control device 2 is provided to control an optical read/write module 51 in an optical disk drive 5. The optical read/write module 51 includes a light-emitting unit 511, a light-sensing unit 512, a temperature measuring unit 513, and digital-to-analog converting (DAC) units 514–516.

Figure 1:
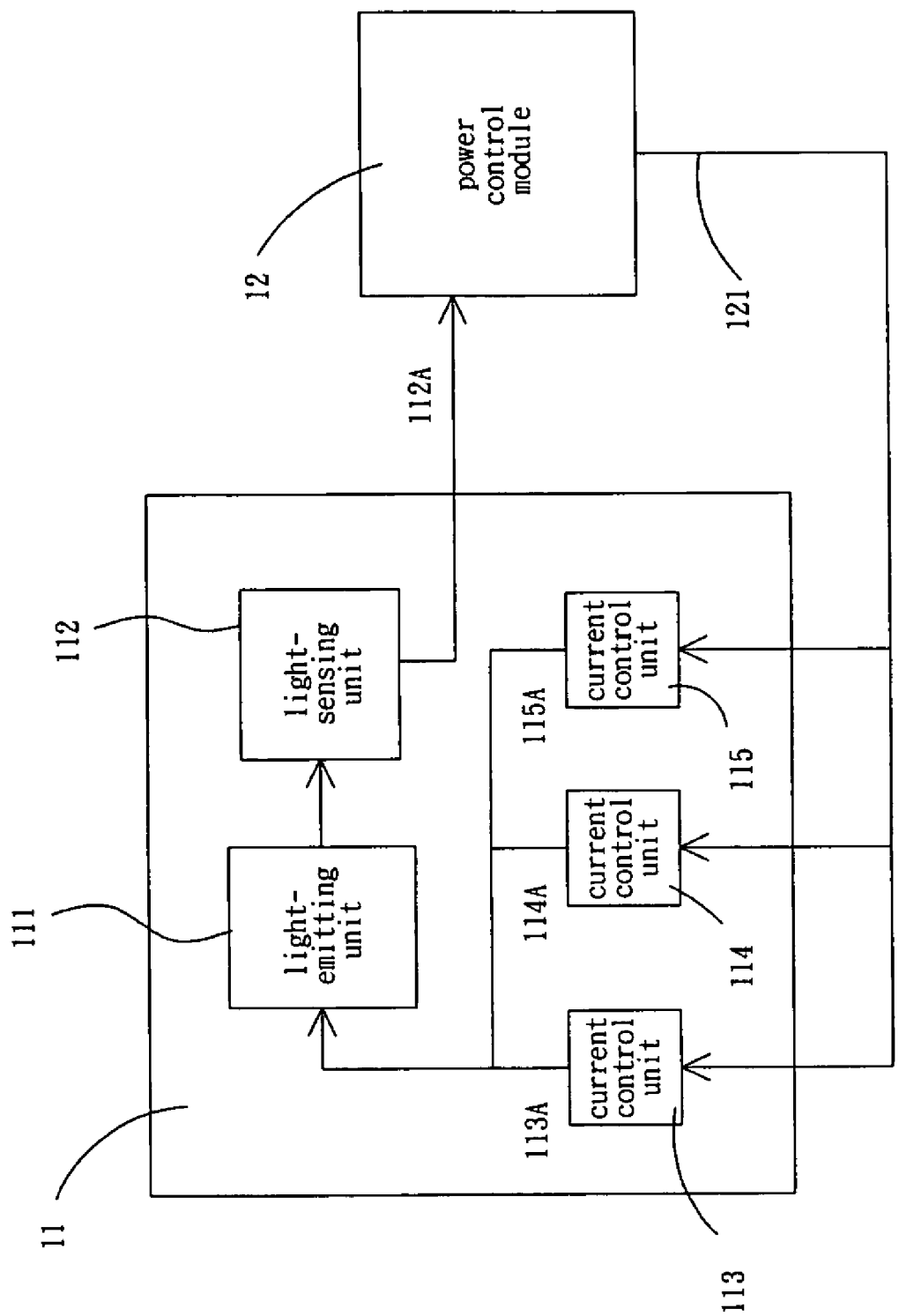
FIG. 1 is a block diagram showing the power control structure of the optical read/write module in the optical disk drive.
Figure 2:
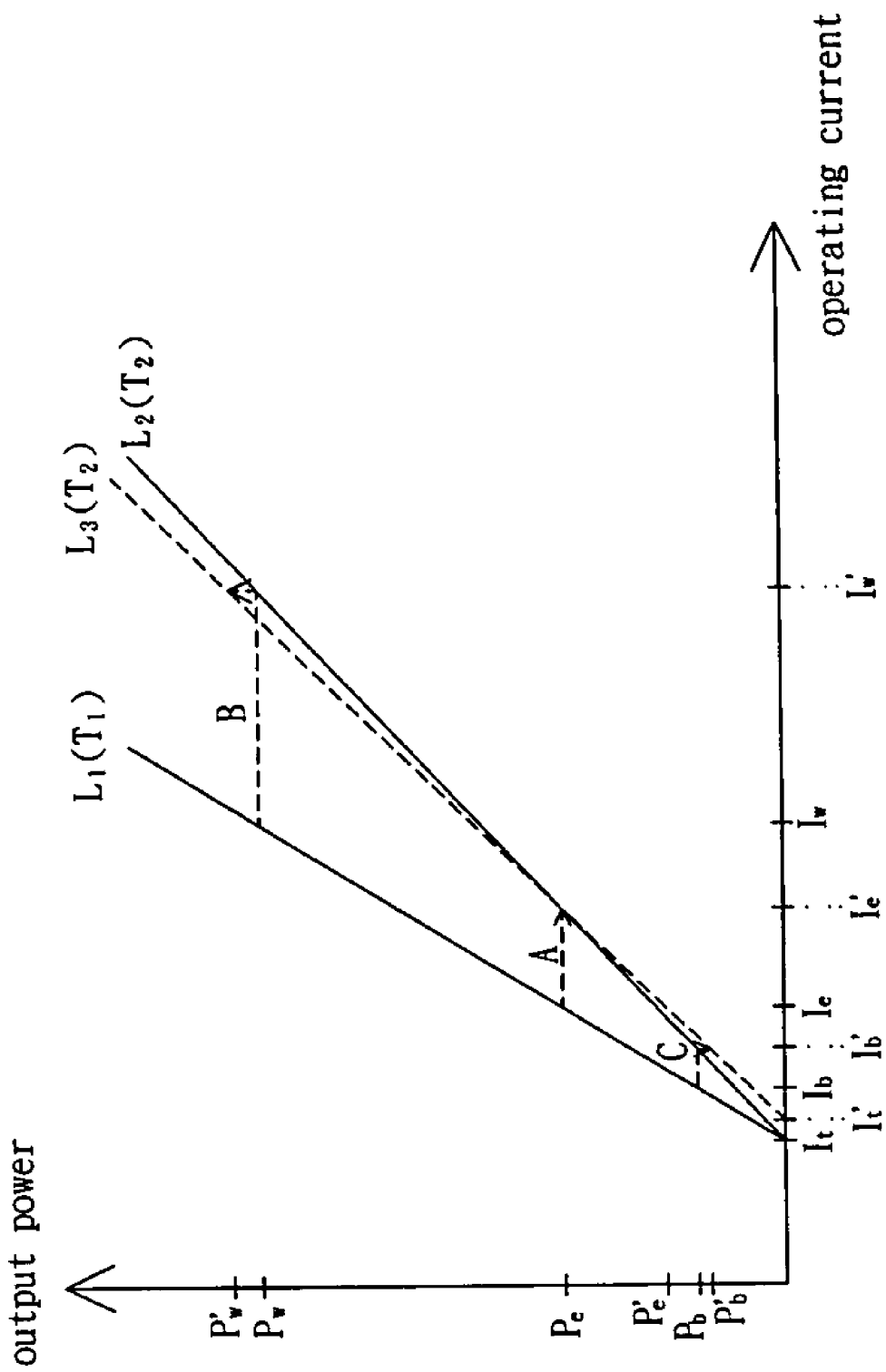
FIG. 2 is a curve relation diagram showing the output power and the operating current of the conventional light-emitting unit.
Figure 3:
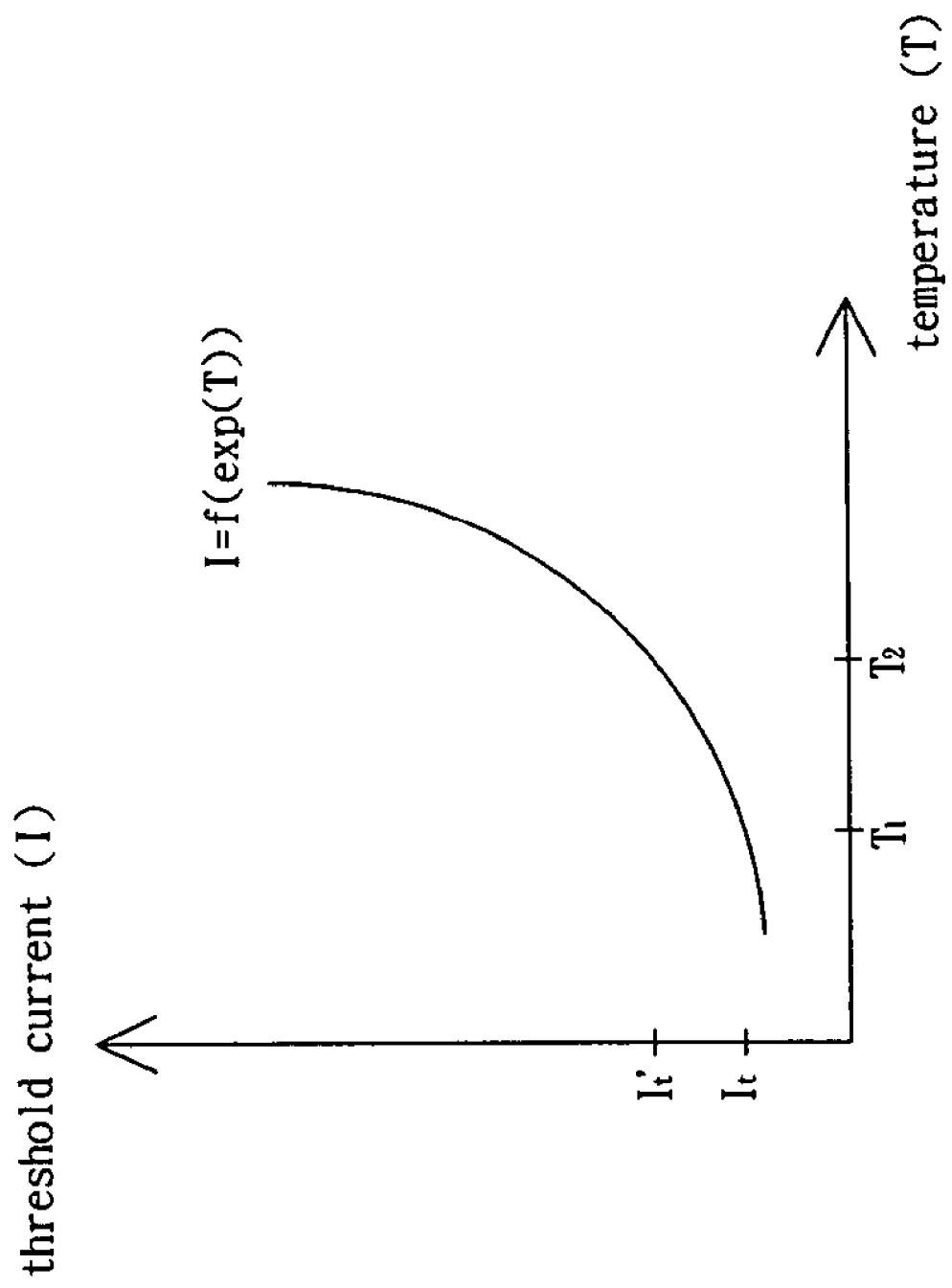
FIG. 3 is a curve relation diagram showing the temperature and the threshold current of the conventional light-emitting unit.
Figure 4:
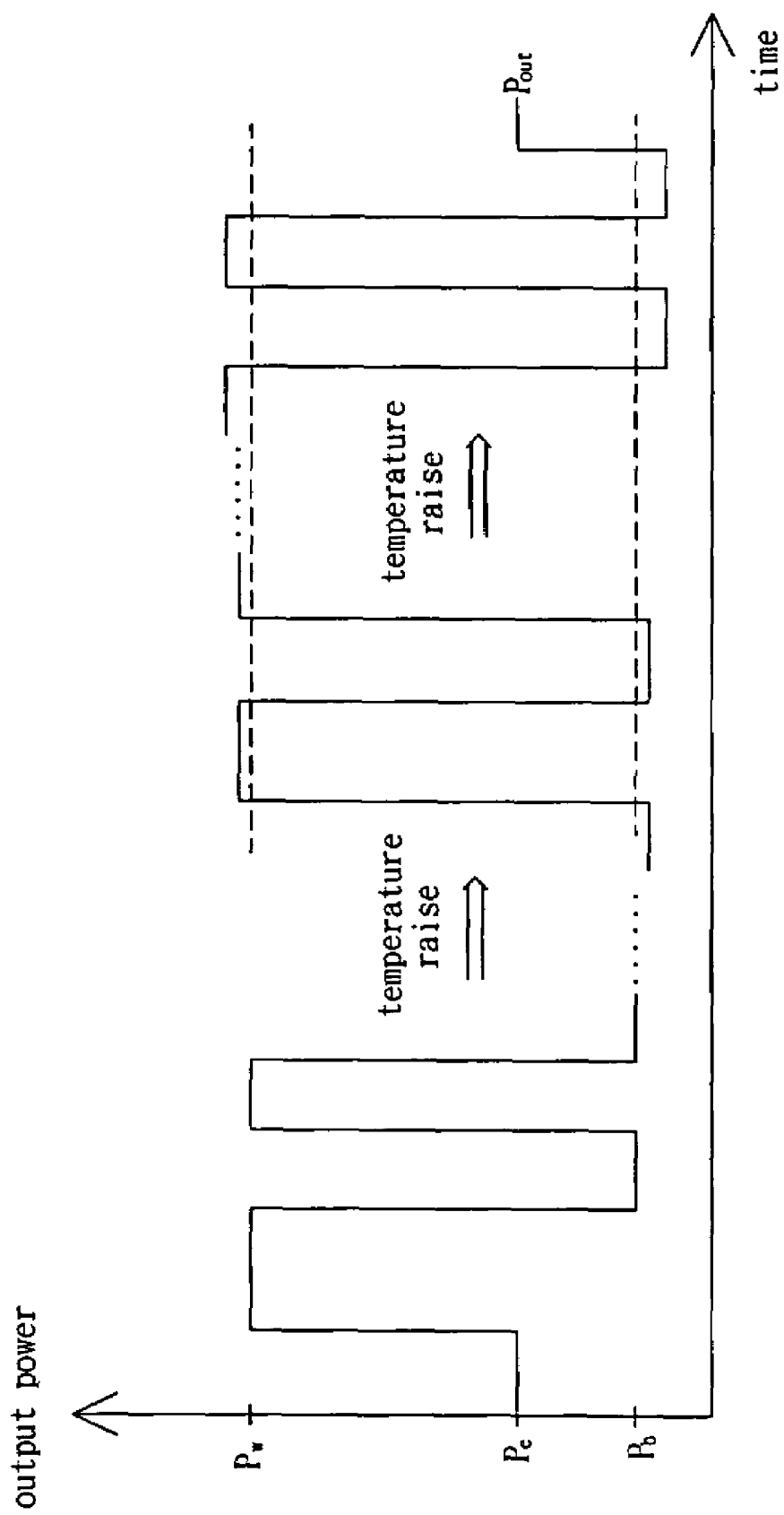
FIG. 4 is a schematic view showing the conventional light-emitting unit generates the output power in the rewriting strategy.
Figure 5:
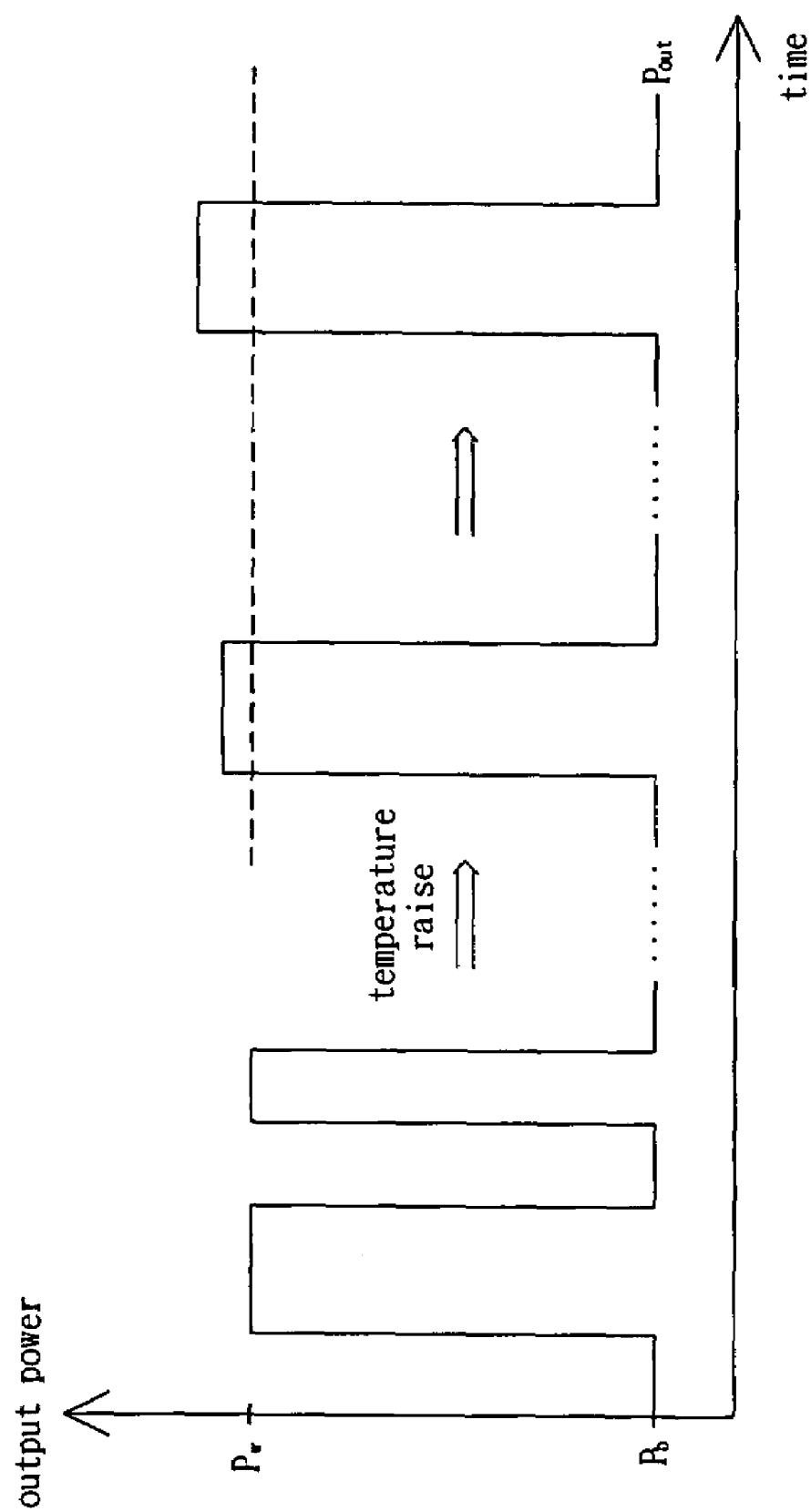
FIG. 5 is a schematic view showing the conventional light-emitting unit generates the output power in the multi pulse writing strategy.

The DAC units 514–516 receive a power control signal 35 to generate currents 45–47 respectively. The light-emitting unit 511 is driven by the currents 45–47 to generate an output power. In general, the light-emitting unit 511 is implemented with a laser diode, therefore the temperature and the threshold current of the light-emitting unit 511 are related in an exponential relationship as shown if FIG. 3. When the temperature of the light-emitting unit 511 increases, the threshold current of the light-emitting unit 511 also increases. Thus an operating current driving the light-emitting unit 511 to light must be larger. Besides, the light-measuring unit 512 measures the output power of the light-emitting unit 511 to generate a power feedback signal 31. The temperature measuring unit 513 measures the temperature of the light-emitting unit 511 to generate a temperature signal 37.

In this embodiment, the power control module 21 generates a base power signal 32 and a reference power signal 36. The current compensating module 22 generates an operating current compensating signal 33 and a threshold compensating signal 34 according to the power feedback signal 31, the temperature signal 37, the base power signal 32 and a function relationship between the temperature and the threshold current of the light-emitting unit 511. The threshold current compensating signal 34 represents the threshold current of the light-emitting unit 511 at this moment. The required current, which drives the light-emitting unit 511 raise the output power from the current output power to the power represented by the base power signal 32, is represented by the operating current compensating signal 33. In addition, the current computing module 23 receives the operating current compensating signal 33 to compute a first operating current signal 41 and a second operating current signal 42 based on the operating current compensating signal 33 according to the base power signal 32 and the reference power signal 36. The current integrating module 24 receives the threshold current compensating signal 34, the first operating current signal 41 and the second operating current signal 42 to generate the power control signal 35 to control the DAC units 514–516 to drive the light-emitting unit 511.

Figure 7:
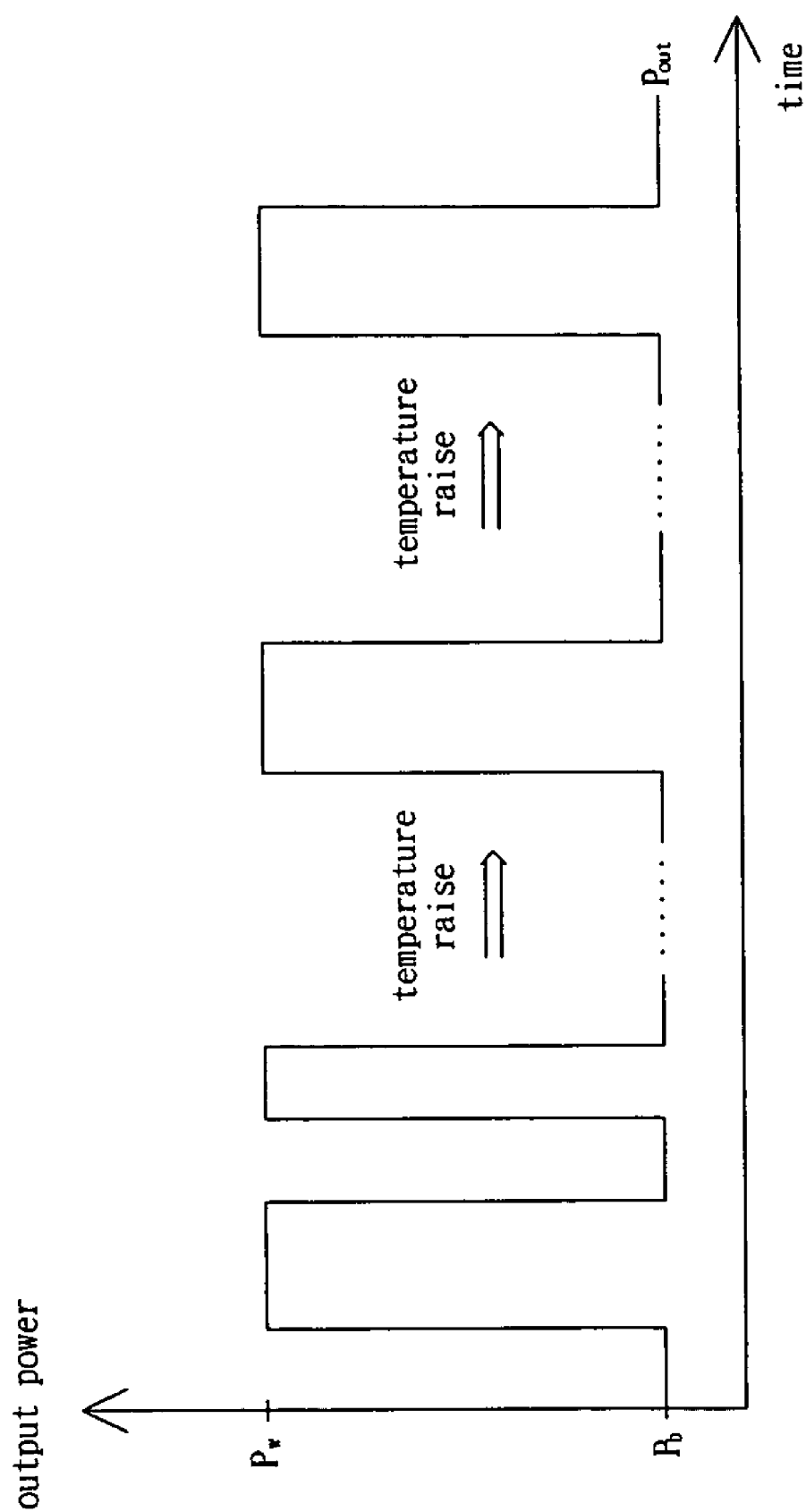
FIG. 7 is a schematic view showing the light-emitting unit of the power control device generates the output power in the multi pulse writing strategy according to the preferred embodiment of the invention.

Referring to FIG. 7, in a multi pulse writing strategy, the base power signal 32 of the power control device 2 is established according to a bias power ($P_b$), and the reference power signal 36 is established according to a writing power ($P_w$). This writing strategy is set up based on the demand for the output power of the optical read/write module in the specification (ex: DVD+R, DVD-R or other optical disk specification).

Figure 8:
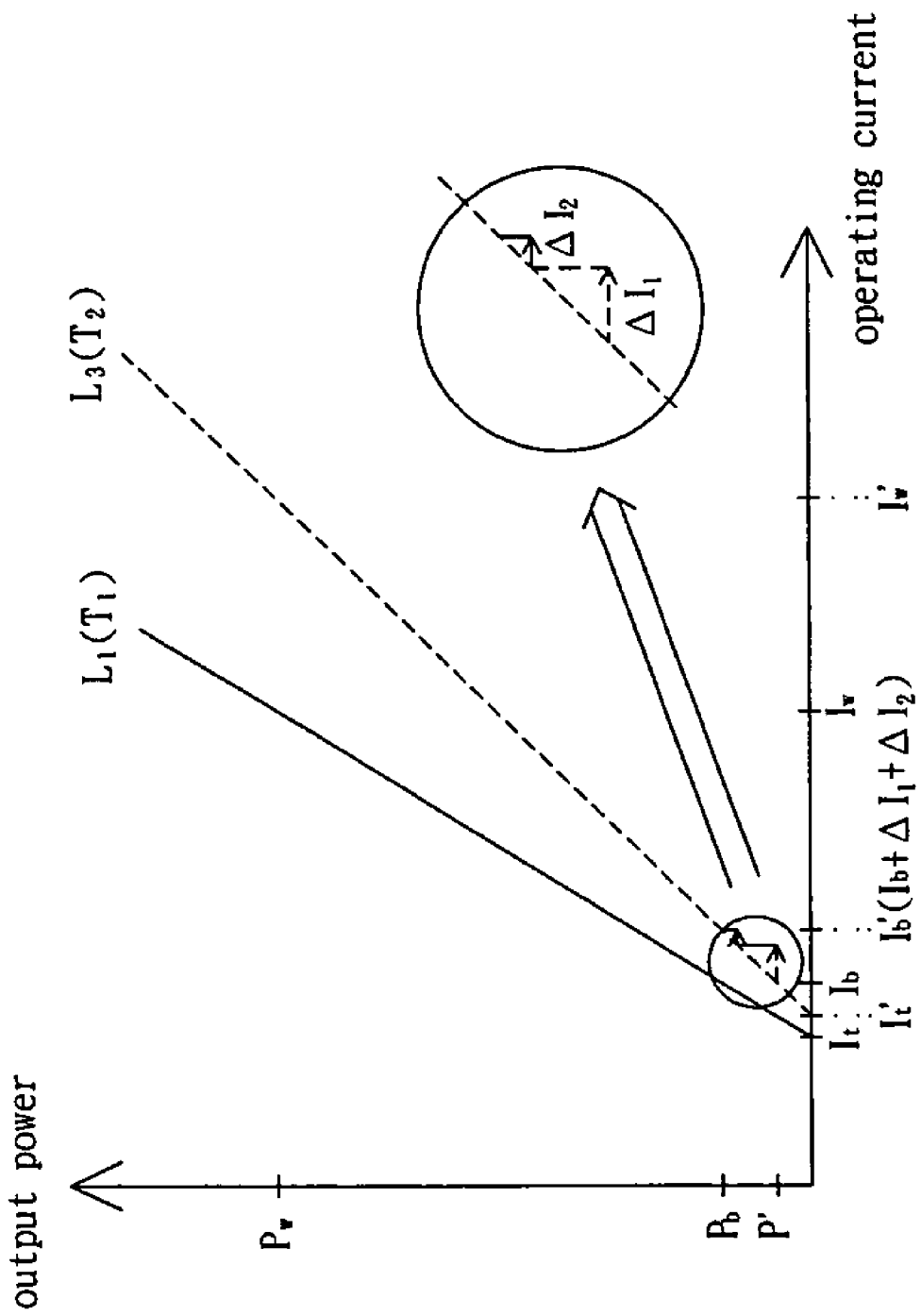
FIG. 8 is a curve relation diagram showing the light-emitting unit of the power control device generates the output power in the multi pulse writing strategy according to the preferred embodiment of the invention.

When the temperature of the light-emitting unit 511 is at temperature $T_1$, the output power and the operating current of the light-emitting unit 511 are related in lines $L_1$ as shown in FIG. 8. At this moment, the threshold current compensating signal 34, the first operating current signal 41 and the second operating current signal 42 represent currents $I_t$, $I_b$–$I_t$, and $I_w$–$I_b$. The compensating unit 241 generates the first threshold current signal 44 ($I_b$) according to the threshold current compensating signal 34 ($I_t$), the first operating current signal 41 ($I_b$–$I_t$). In addition, the integrating unit 242 generates the power control signal 35 according to the first threshold current signal 44 and the second operating current signal 42. Therefore the DAC unit 514, 515 are controlled to generate the currents 45, 46 as current $I_b$, $I_w$–$I_b$. Thus, the light-emitting unit 511 is driven by the combinations of the currents 45, 46 to generate different output powers (ex: $P_b$ and $P_w$).

When the temperature of the light-emitting module 41 raises to the temperature $T_2$, the output power and the operating current of the light-emitting unit 511 are related in lines $L_3$. The current compensating module 22 of the power control device 2 computes a difference ($I_t'$–$I_t$) of threshold current at temperature $T_1$ and $T_2$ according to the temperature signal 37. The current compensating module 22 computes the required operating current ($\Delta I_1$), which drives the light-emitting unit 511 to generate correct power, according to the base power signal 32 and the power feedback signal 31 in the way of a close loop feedback control. Then the current compensating module 22 compare the required operating current ($\Delta I_1$) and the difference of the threshold current ($I_t'$–$I_t$) to output the threshold current compensating signal 34 ($I_t'$) and the operating current compensating signal 33 ($\Delta I_1$–$I_t'$). The current computing module 23 update the first operating current signal 41 and the second operating current signal 42 according to the proportion of the reference power signal 36 to the base power signal 32 as shown in formula (2) and (3).

$$S_{41}' = S_{32} \times \frac{P_b}{P_b} + S_{41} = (\Delta I_1 - I_t) \times \frac{P_b}{P_b} + I_b \quad (2)$$

$$S_{42}' = S_{32} \times \frac{P_w - P_b}{P_b} + S_{42} = (\Delta I_1 - I_t) \times \frac{P_w - P_b}{P_b} + (I_w - I_b) \quad (3)$$

$S_{41}$: the previous first operating current signal 41
$S_{41}'$: the update first operating current signal 41
$S_{42}$: the previous second operating current signal 42
$S_{42}'$: the update second operating current signal 42
$S_{32}$: the base power signal The current integrating module 24 receives the threshold current signal 34, the first operating current signal 41 and the second operating current signal 42 to generate the power control signal 35. After the DAC units 514, 515 are controlled by the power control signal 35 to drive the light-emitting unit 511, the current compensating module 22 computes the required operating current ($\Delta I_2$) again according to the base power signal 32 and the power feedback signal 31 in the way of a close loop feedback control. Because the temperature of the light-emitting unit 511 does not change, the current compensating module 22 does not need to compensate the threshold current of the light-emitting unit 511, and it outputs the threshold current compensating signal 34 ($I_t'$) and the operating current compensating signal 33 ($\Delta I_2$).

Then the current computing module 23 updates the first operating current signal 41 and the second operating current signal 42 according to the proportion of the reference power signal 36 to the base power signal 32 as shown in formula (4) and (5).

$$S_{41}' = S_{32} \times \frac{P_b}{P_b} + S_{41} = \Delta I_2 \times \frac{P_b}{P_b} + \left((\Delta I_1 - I_t) \times \frac{P_b}{P_b} + I_b\right) = I_b' \quad (4)$$

$$S_{42}' = S_{32} \times \frac{P_w - P_b}{P_b} + S_{42} =$$

$$\Delta I_2 \times \frac{P_w - P_b}{P_b} + \left((\Delta I_1 - I_t) \times \frac{P_w - P_b}{P_b} + (I_w - I_b)\right)$$

$$= (\Delta I_1 + \Delta I_2 - I_t) \times \frac{P_w - P_b}{P_b} + (I_w - I_b) = I_w' - I_b' \quad (5)$$

The compensating unit 241 updates the first threshold current signal 44, thus the integrating unit 242 control the DAC units 514, 515 to generate currents 45, 46 as currents $I_b'$, $I_w'$–$I_b'$. Therefore the currents 45, 46 drive the light-emitting unit 511 to generate the output power $P_b$ and $P_w$. In conclusion, when the temperature of the light-emitting unit 511 raise and control by the above method, the output power $P_{out}$ of the light-emitting unit 511 is controlled precisely at the bias power $P_b$ and the writing power $P_w$ in the multi pulse writing strategy.

Figure 9:
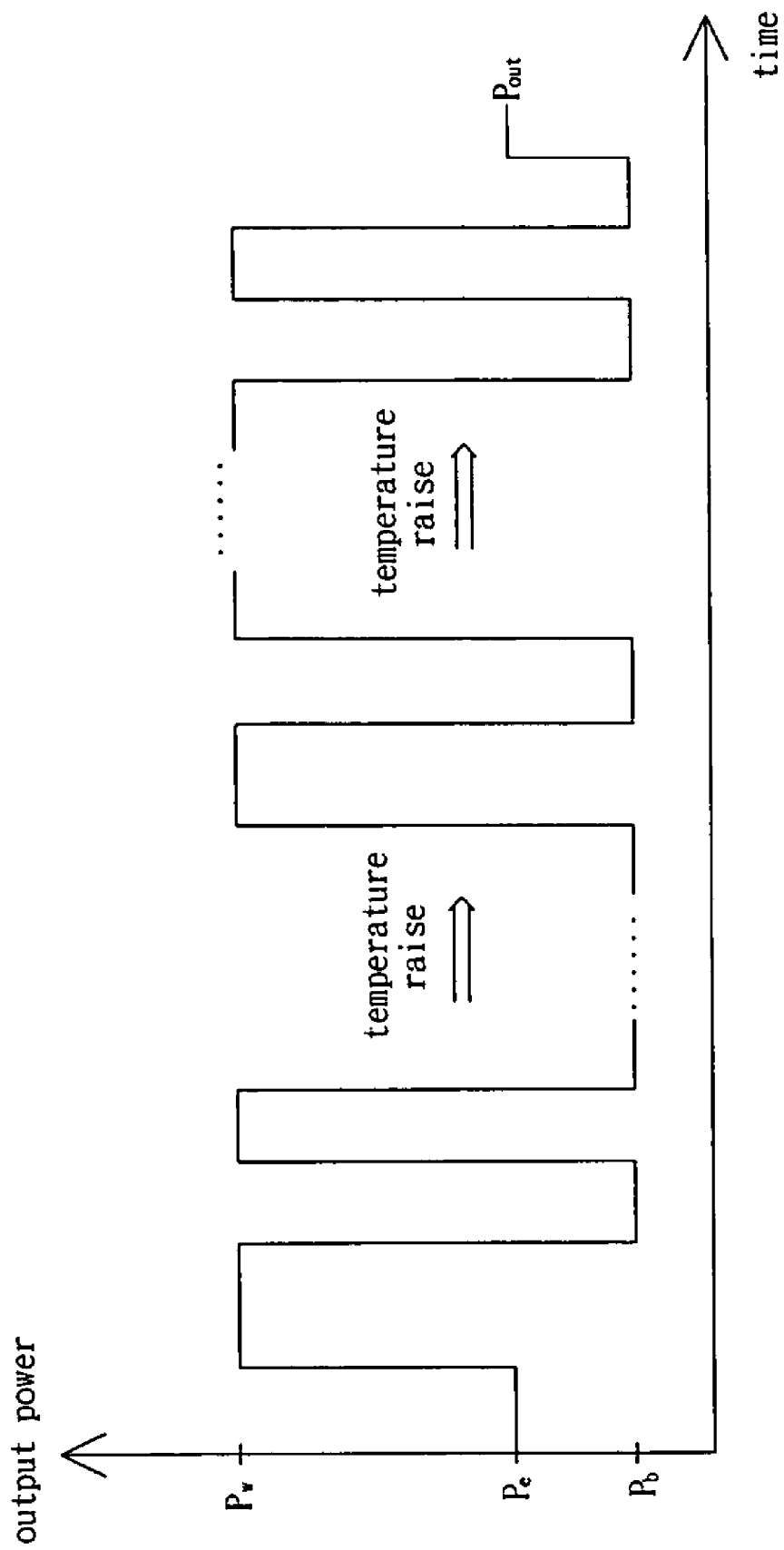
FIG. 9 is a schematic view showing the light-emitting unit of the power control device generates the output power in the rewriting strategy according to the preferred embodiment of the invention.

Referring to FIG. 9, in a rewriting strategy, the base power signal 32 of the power control device 2 is established according to a erasing power ($P_e$) and the reference power signal 36 is established according to a writing power ($P_w$). In addition, a reference power signal 37 is established according to a bias power ($P_b$). This writing strategy is set up based on the demand for the output power of the optical read/write module in the specification (ex: DVD+RW, DVD−RW or other optical disk specification).

Figure 10:
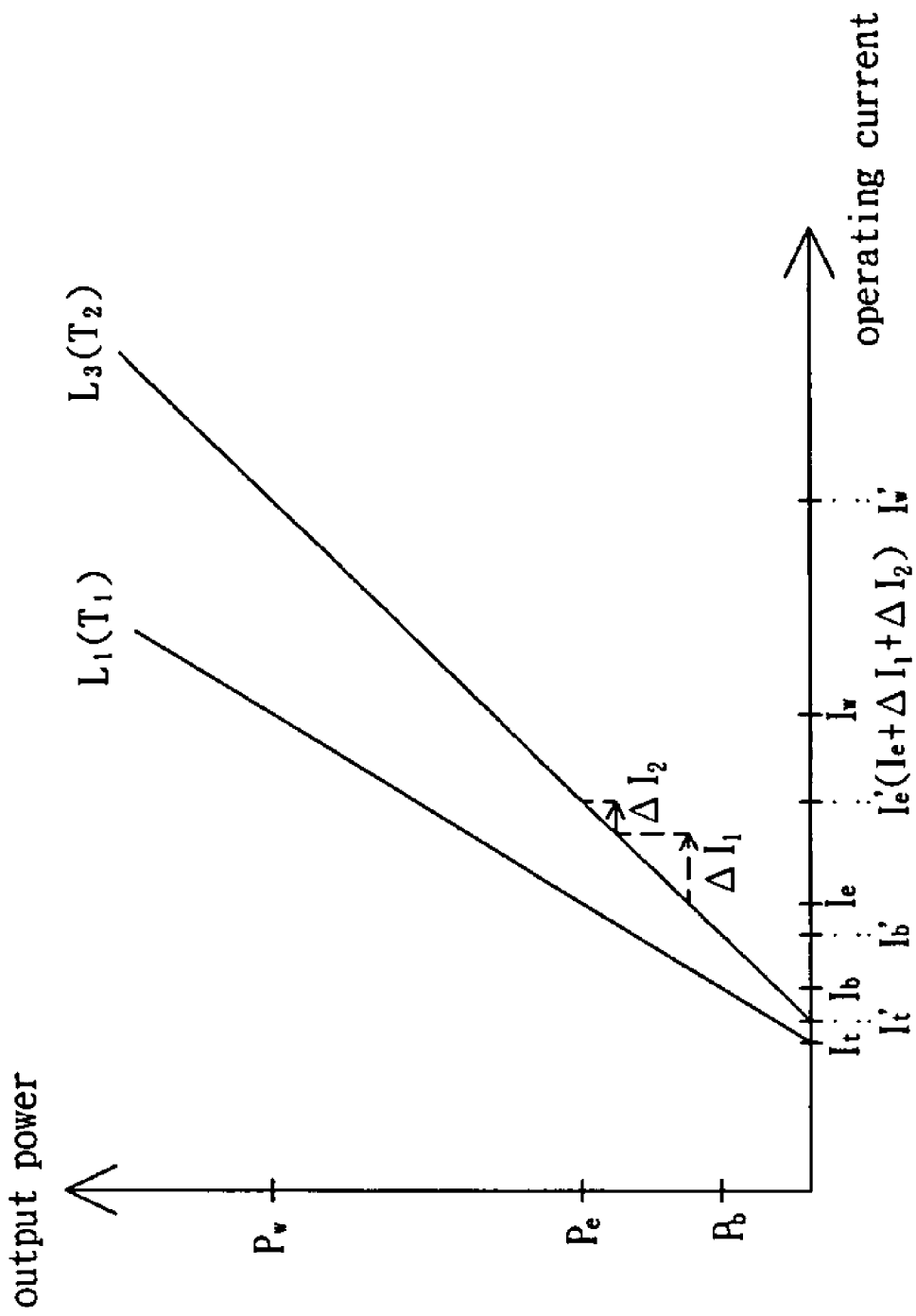
FIG. 10 is a curve relation diagram showing the light emitting unit of the power control device generates the output power in the rewriting strategy according to the preferred embodiment of the invention.

When the temperature of the light-emitting unit 511 is at temperature $T_1$, the output power and the operating current of the light-emitting unit 511 are related in lines $L_1$ as shown in FIG. 10. At this moment, the threshold current compensating signal 34, the first operating current signal 41, the second operating current signal 42 and operating current signal 42 third operating current signal 43 represent currents $I_t$, $I_b-I_t$, $I_e-I_b$ and $I_w-I_e$. The compensating unit 241 generates the first threshold current signal 44 ($I_b$) according to the threshold current compensating signal 34 ($I_t$), the first operating current signal 41 ($I_b-I_t$). In addition, the integrating unit 242 generates the power control signal 35 according to the first threshold current signal 44, the second operating current signal 42 and the third operating current signal 43. Therefore the DAC unit 514–516 are controlled to generate the currents 45, 46 and 47 as current $I_b$, $I_e-I_b$ and $I_w-I_e$. Thus, the light-emitting unit 511 is driven by the combinations of the currents 45–47 to generate different output powers (ex: $P_b$, $P_e$ and $P_w$).

With difference to the multi pulse strategy, when the temperature of the light-emitting module 41 raises from the temperature $T_1$ to $T_2$, the current computing module 23 update the first operating current signal 41, the second operating current signal 42 and the third operating current signal 43 according to the proportion of the reference power signal 36, 38 to the base power signal 32 as shown in formula (6) and (8).

$$S'_{41} = S_{32} \times \frac{P_b}{P_e} + S_{41} = (\Delta I_1 - I_t) \times \frac{P_b}{P_e} + I_b \qquad (6)$$

$$S'_{42} = S_{32} \times \frac{P_e - P_b}{P_e} + S_{42} = (\Delta I_1 - I_t) \times \frac{P_e - P_b}{P_e} + (I_e - I_b) \qquad (7)$$

$$S'_{43} = S_{32} \times \frac{P_w - P_e}{P_e} + S_{43} = (\Delta I_1 - I_t) \times \frac{P_w - P_e}{P_e} + (I_w - I_e) \qquad (8)$$

$S_{43}$: the previous third operating current signal 43
$S_{43}'$: the update third operating current signal 43

The current integrating module 26 receives the threshold current signal 34, the first operating current signal 41, the second operating current signal 42 and the third operating current signal 43 to generate the power control signal 35. After the DAC units 514–516 are controlled by the power control signal 35 to drive the light-emitting unit 511, the current computing module 23 updates the first operating current signal 41 and the second operating current signal 42 according to the proportion of the reference power signal 36 to the base power signal 32 as shown in formula (9) and (11).

$$S'_{41} = S_{32} \times \frac{P_b}{P_e} + S_{41} = \Delta I_2 \times \frac{P_b}{P_e} + \left((\Delta I_1 - I_t) \times \frac{P_b}{P_e} + I_b\right) = I'_b \qquad (9)$$

$$S'_{42} = S_{32} \times \frac{P_e - P_b}{P_e} + S_{42} =$$
$$\Delta I_2 \times \frac{P_e - P_b}{P_e} + \left((\Delta I_1 - I_t) \times \frac{P_e - P_b}{P_e} + (I_e - I_b)\right)$$
$$= (\Delta I_1 + \Delta I_2 - I_t) \times \frac{P_e - P_b}{P_e} + (I_e - I_b) = I'_e - I'_b \qquad (10)$$

$$S'_{43} = S_{32} \times \frac{P_w - P_e}{P_e} + S_{43} = \qquad (11)$$
$$\Delta I_2 \times \frac{P_w - P_e}{P_e} + \left((\Delta I_1 - I_t) \times \frac{P_w - P_e}{P_e} + (I_w - I_e)\right)$$
$$= (\Delta I_1 + \Delta I_2 - I_t) \times \frac{P_w - P_e}{P_e} + (I_w - I_e) = I'_w - I'_e$$

The compensating unit 241 updates the first threshold current signal 44, thus the integrating unit 242 control the DAC units 514–516 to generate currents 45, 46 and 47 as currents $I_b'$, $I_e'-I_b'$, and $I_w'-I_e'$. Therefore the current 45–47 drive the light-emitting unit 511 to generate the output power $P_b$, $P_e$ and $P_w$. In conclusion, when the temperature of the light-emitting unit 511 raise and control by the above method, the output power $P_{out}$ of the light-emitting unit 511 is controlled precisely at the bias power $P_b$, the erasing power $P_e$, and the writing power $P_w$ in the rewriting strategy.

Figure 11:
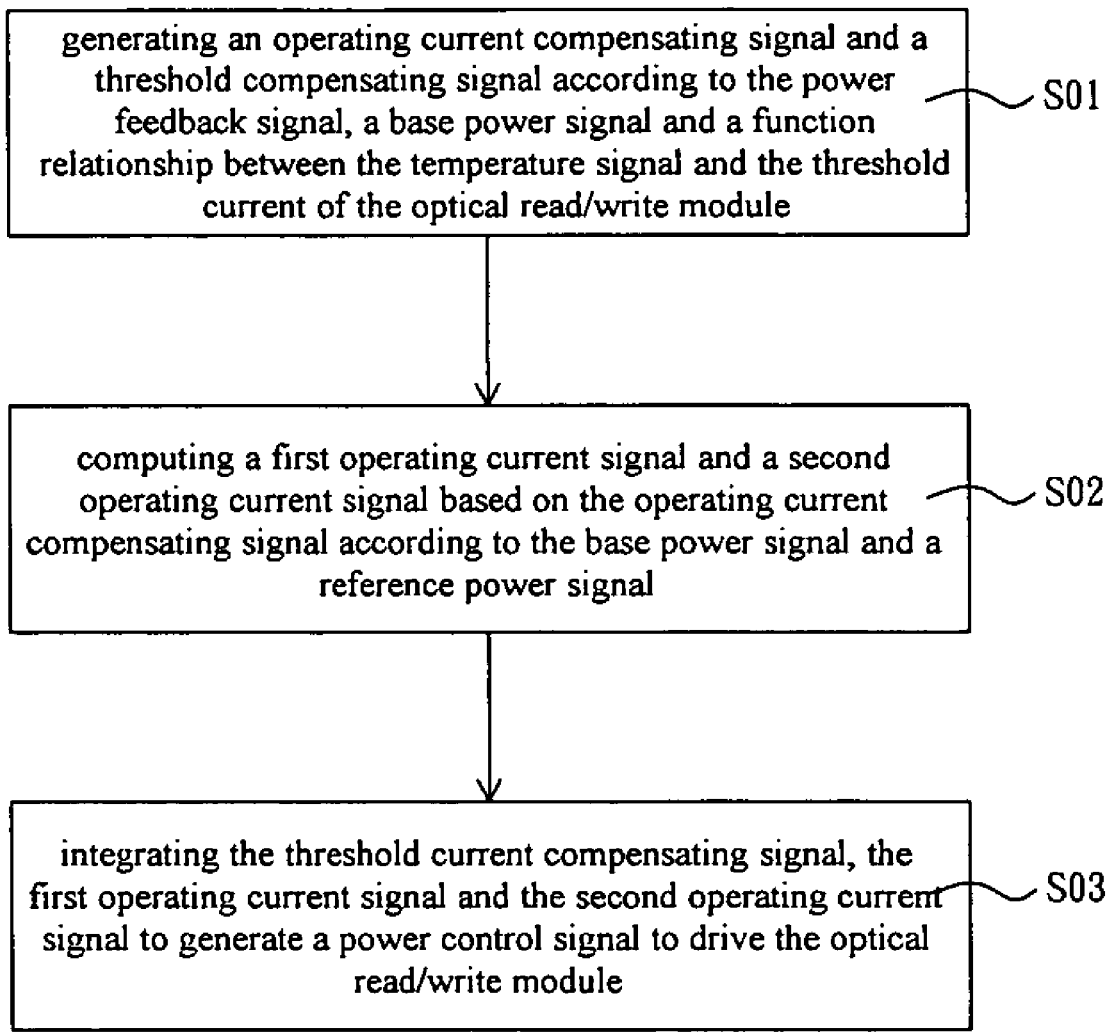
FIG. 11 is a flow chart showing a power control method of single base power according to a preferred embodiment of the invention.

Referring to FIG. 11, a power control method of single base power according to a preferred embodiment of the invention is provided for an optical read/write module of an optical disk drive. The optical read/write module generates a power feedback signal and a temperature signal. The power control method includes the steps S01–S03. The step S01 generates an operating current compensating signal and a threshold compensating signal according to the power feedback signal, a base power signal and a function relationship between the temperature signal and the threshold current of the optical read/write module. The step S02 computes a first operating current signal and a second operating current signal based on the operating current compensating signal according to the base power signal and a reference power signal. The step S03 integrates the threshold current compensating signal, the first operating current signal and the second operating current signal to generate a power control signal to drive the optical read/write module. The power control method in the embodiment can be applied to the power control method device as mentioned in the above embodiment as shown in FIG. 6 to FIG. 10. Thus, the power control method of this embodiment can be realized with referring to the previous embodiment, and the detailed descriptions are omitted here.

In summary, since the power control device and method compensate the threshold current of the optical read/write module according to the temperature signal of the optical read/write module, the effect of the threshold current is regarded. And the distinct required operating currents driving the optical read/write module to generate different output power are computed base on a single base power, such that the output power of the optical read/write module is precisely controlled.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A power control device of single base power for an optical read/write module of an optical disk drive, wherein the optical read/write module generates a power feedback signal and a temperature signal, the device comprising:

a current compensating module generating an operating current compensating signal and a threshold compensating signal according to the power feedback signal, the temperature signal, a base power signal and a function relationship between the temperature signal and the threshold current of the optical read/write module;
a current computing module receiving the operating current compensating signal to compute a first operating current signal and a second operating current signal based on the operating current compensating signal according to the base power signal and a reference power signal; and
a current integrating module receiving the threshold current compensating signal, the first operating current signal and the second operating current signal to generate a power control signal so as to drive the optical read/write module.

2. The power control device of single base power as recited in claim 1, wherein the current compensating module receives the temperature signal to generate the threshold current compensating signal according to the function relationship between the temperature signal and the threshold current of the optical read/write module, and receives the power feedback signal and the base power signal to generate the operating current compensating signal according to a proportion of the power feedback signal to the base power signal.

3. The power control device of single base power as recited in claim 2, wherein the base power signal is established according to an erasing power in a rewritable writing strategy, and the reference power signal is established according to a writing power in the rewritable writing strategy.

4. The power control device of single base power as recited in claim 2, wherein the base power signal is established according to an erasing power in a rewritable writing strategy, and the reference power signal is established according to a bias power in the rewritable writing strategy.

5. The power control device of single base power as recited in claim 1, wherein the optical read/write module receives the power control signal to generate an output power equal to the power represented by the base power signal.

6. The power control device of single base power as recited in claim 1, wherein the current integrating module comprises:
a compensating unit receiving the threshold current compensating signal and the first operating current signal to sum the threshold current compensating signal and the first operating current signal to output a first threshold current signal; and
a integrating unit, receiving the first threshold current signal and the second operating current signal to generate the power control signal, and the optical read/write module receives the power control signal to generate an output power equal to the power represented by the base power signal.

7. The power control device of single base power as recited in claim 1, wherein the optical read/write module receives the power control signal to generate an output power equal to the power represented by the reference power signal.

8. The power control device of single base power as recited in claim 1, wherein the current integrating module comprises:
a compensating unit receiving the threshold current compensating signal and the first operating current signal to sum the threshold current compensating signal and the first operating current signal to output a first threshold current signal; and
a integrating unit, receiving the first threshold current signal and the second operating current signal to generate the power control signal, and the optical read/write module receives the power control signal to generate an output power equal to the power represented by the reference power signal.

9. The power control device of single base power as recited in claim 1, wherein the base power signal is established according to a bias power in a multi pulse writing strategy, and the reference power signal is established according to a writing power in the multi pulse writing strategy.

10. The power control device of single base power as recited in claim 1, wherein the optical read/write module comprises:
a current control unit receiving the power control signal to generate an operating current;
a light-emitting unit driven by the operating current to generate an output power wherein the function relationship is an exponential relationship between the temperature and the threshold current of the light-emitting unit;
a light-sensing unit measuring the output power to generate the power feedback signal; and
a temperature measuring unit measuring the temperature of the optical read/write module to generate the temperature signal.

11. A power control method of single base power for an optical read/write module of an optical disk drive, wherein the optical read/write module generates a power feedback signal and a temperature signal, the method comprising:
generating an operating current compensating signal and a threshold compensating signal according to the power feedback signal, a base power signal and a function relationship between the temperature signal and the threshold current of the optical read/write module;
computing a first operating current signal and a second operating current signal based on the operating current compensating signal according to the base power signal and a reference power signal; and
integrating the threshold current compensating signal, the first operating current signal and the second operating current signal to generate a power control signal to drive the optical read/write module.

12. The power control method of single base power as recited in claim 11, wherein the generating step generates the threshold current compensating signal according to the function relationship between the temperature signal and the threshold current of the optical read/write module, and generates the operating current compensating signal according to a proportion of the power feedback signal to the base power signal.

13. The power control method of single base power as recited in claim 11, wherein the optical read/write module receives the power control signal to generate an output power equal to the power represented by the base power signal.

14. The power control method of single base power as recited in claim 11, wherein the integrating step comprises:
summing the threshold current compensating signal and the first operating current signal to output a first threshold current signal; and
integrating the first threshold current signal and the second operating current signal to generate the power control signal, and the optical read/write module receives the power control signal to generate an output power equal to the power represented by the base power signal.

15. The power control method of single base power as recited in claim 11, wherein the optical read/write module receives the power control signal to generate an output power equal to the power represented by the reference power signal.

16. The power control method of single base power as recited in claim 11, wherein the integrating step comprises:
    summing the threshold current compensating signal and the first operating current signal to output a first threshold current signal; and
    integrating the first threshold current signal and the second operating current signal to generate the power control signal, and the optical read/write module receives the power control signal to generate an output power equal to the power represented by the reference power signal.

17. The power control method of single base power as recited in claim 11, wherein the base power signal is established according to a bias power in a multi pulse writing strategy, and the reference power signal is established according to a writing power in the multi pulse writing strategy.

18. The power control method of single base power as recited in claim 11, wherein the base power signal is established according to an erasing power in a rewritable writing strategy, and the reference power signal is established according to a writing power in the rewritable writing strategy.

19. The power control method of single base power as recited in claim 11, wherein the base power signal is established according to an erasing power in a rewritable writing strategy, and the reference power signal is established according to a bias power in the rewritable writing strategy.

20. The power control method of single base power as recited in claim 11, wherein the optical read/write module comprises:
    a current control unit receiving the power control signal to generate an operating current;
    a light-emitting unit driven by the operating current to generate an output power wherein the function relationship is an exponential relationship between the temperature and the threshold current of the light-emitting unit;
    a light-sensing unit measuring the output power to generate the power feedback signal; and
    a temperature measuring unit measuring the temperature of the optical read/write module to generate the temperature signal.

* * * * *